US012615052B2

(12) United States Patent
Abadi et al.

(10) Patent No.: US 12,615,052 B2
(45) Date of Patent: Apr. 28, 2026

(54) POWER SUPPLY-BASED COMPENSATION

(71) Applicant: NVIDIA Corporation, Santa Clara, CA (US)

(72) Inventors: Ofek Abadi, Nahariya (IL); Naor Peretz, Kiryat Ata (IL)

(73) Assignee: NVIDIA Corporation, Santa Clara, CA (US)

( * ) Notice: Subject to any disclaimer, the term of this patent is extended or adjusted under 35 U.S.C. 154(b) by 134 days.

(21) Appl. No.: 18/678,127

(22) Filed: May 30, 2024

(65) Prior Publication Data

US 2025/0373258 A1 Dec. 4, 2025

(51) Int. Cl.
H03M 1/08 (2006.01)
H03M 1/10 (2006.01)
H03M 1/12 (2006.01)

(52) U.S. Cl.
CPC ......... H03M 1/089 (2013.01); H03M 1/1009 (2013.01); H03M 1/125 (2013.01)

(58) Field of Classification Search
CPC ..... H03M 1/089; H03M 1/1009; H03M 1/125

USPC ......................................... 341/119, 120, 155
See application file for complete search history.

(56) References Cited

U.S. PATENT DOCUMENTS

| | | | | |
|---|---|---|---|---|
| 2002/0021239 A1* | 2/2002 | Lance | ................... | G01N 25/72 |
| | | | | 341/155 |
| 2006/0265174 A1* | 11/2006 | Doyle | ................... | G01K 7/015 |
| | | | | 374/E1.005 |

* cited by examiner

*Primary Examiner* — Khai M Nguyen
(74) *Attorney, Agent, or Firm* — Lowenstein Sandler LLP

(57) ABSTRACT

An integrated circuit includes an analog-to-digital converter (ADC), associated with a thermal sensor, to determine a present power supply value of a power supply voltage for the thermal sensor. E-fuse registers store a set of calibrated temperature values, from the thermal sensor, for each power supply value of a plurality of power supply values. Control logic is coupled to the ADC and the e-fuse registers. The control logic reads the present power supply value from the ADC and generates, based on the present power supply value and the plurality of power supply values, a calibration equation that relates calibrated temperature values to thermal sensor values for the present power supply value.

20 Claims, 6 Drawing Sheets

<u>300</u>

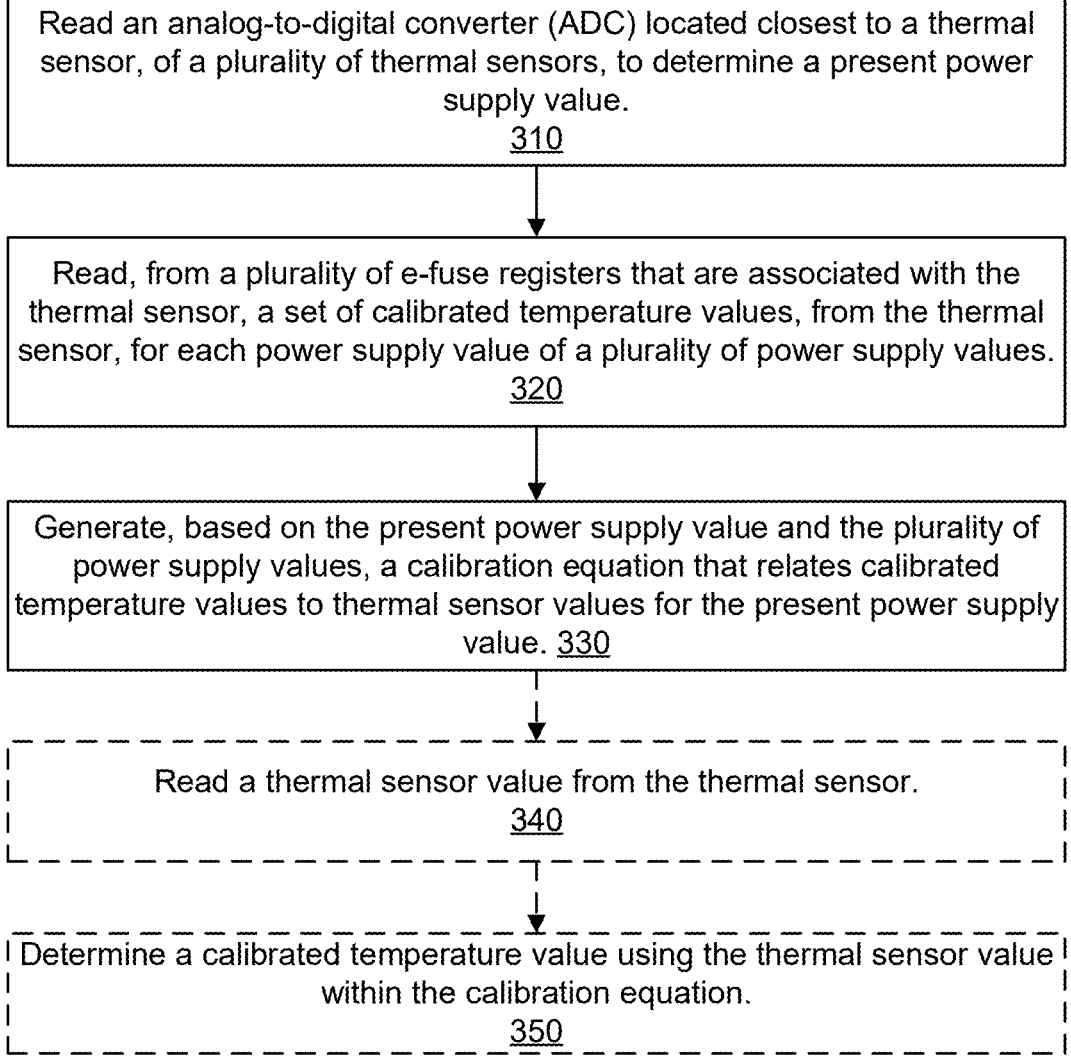

Read an analog-to-digital converter (ADC) located closest to a thermal sensor, of a plurality of thermal sensors, to determine a present power supply value.
<u>310</u>

Read, from a plurality of e-fuse registers that are associated with the thermal sensor, a set of calibrated temperature values, from the thermal sensor, for each power supply value of a plurality of power supply values.
<u>320</u>

Generate, based on the present power supply value and the plurality of power supply values, a calibration equation that relates calibrated temperature values to thermal sensor values for the present power supply value. <u>330</u>

Read a thermal sensor value from the thermal sensor.
<u>340</u>

Determine a calibrated temperature value using the thermal sensor value within the calibration equation.
<u>350</u>

POWER SUPPLY-BASED COMPENSATION

TECHNICAL FIELD

At least one embodiment generally pertains to integrated circuits (ICs) or IC dies, and more specifically, but not exclusively, to power supply-based compensation for die thermal sensing.

BACKGROUND

In many applications in which integrated circuits (ICs) or IC dice operate, there are system requirements for real-time thermal reads from areas, but especially in digital domain areas within the ICs. Thermal sensors that operate on the same digital power supply as the digital units are used for this purpose. Due to global and local variations in the silicon production (among other material processes), the accuracy of the thermal readings of the thermal sensors is degraded. This accuracy degradation is common for any thermal sensor inside an IC die. The level of accuracy degradation depends on the architecture and design of the thermal sensors, and can vary with the digital power supply.

BRIEF DESCRIPTION OF DRAWINGS

Various embodiments in accordance with the present disclosure will be described with reference to the drawings, in which:

FIG. 3 is a flow chart of an example method for determining power supply-based compensation for die thermal sensing according to some embodiments;

DETAILED DESCRIPTION

Figure 1A:
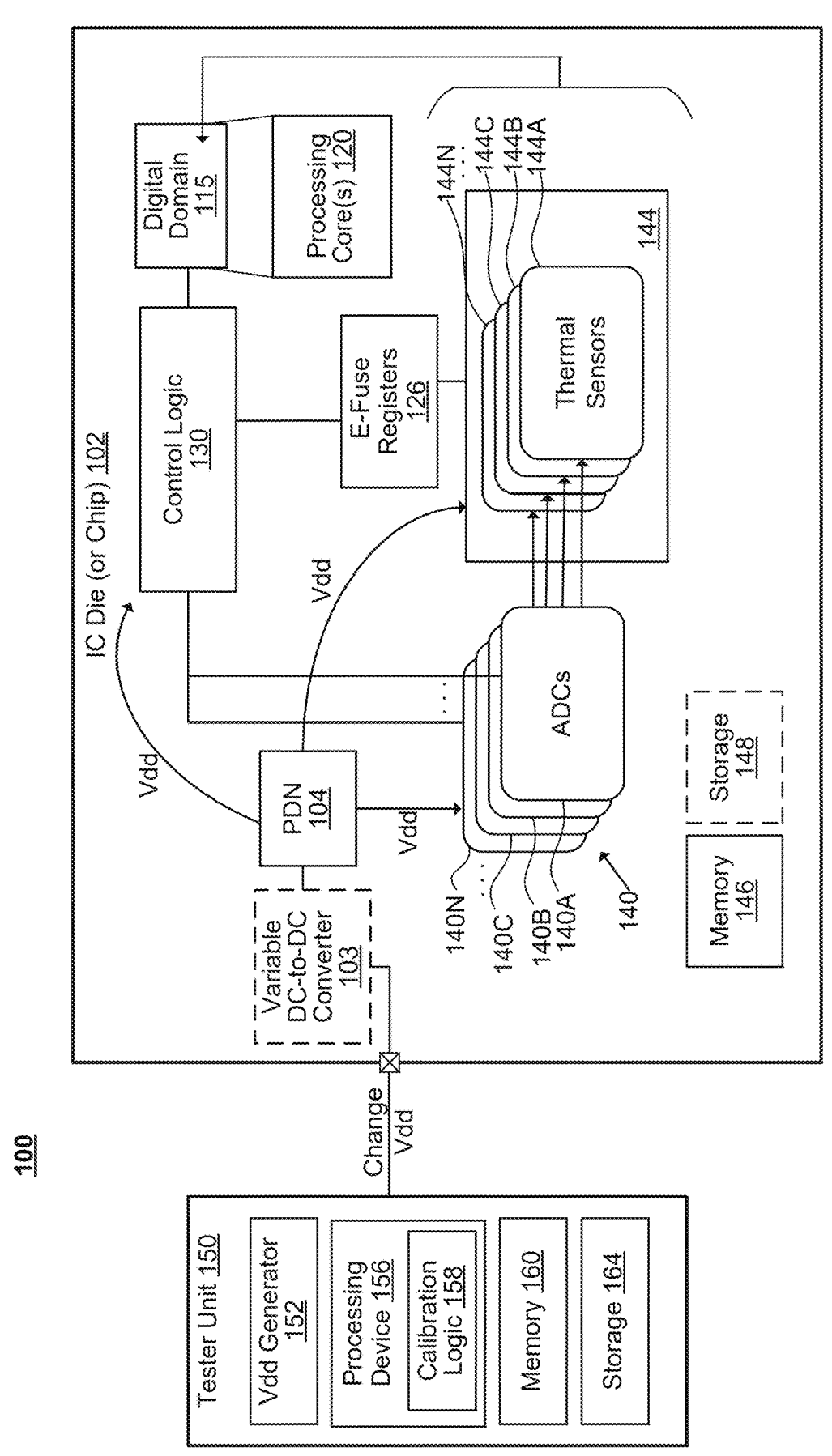
FIGS. 1A-1B are a schematic block diagram of an example thermal testing system implementing power supply-based compensation for die thermal sensing according to various embodiments.

Present methods of calibrating thermal sensors to reduce accuracy degradation during functional operation are insufficient. These methods are insufficient because, among other reasons, many applications include a system requirement for real-time thermal reads from digital domain areas and thermal sensor outputs can vary with supply voltage. Indeed, a major error contributor for the sensing accuracy is power supply variation. For example, large variations in power supply to a given thermal sensor can degrade the quality of the thermal readings significantly. Although the accuracy could be improved by designing a more robust sensor with higher power supply rejection ratio, the penalty in power consumption and area is unacceptable for most applications.

For example, a digital domain-based sensor can operate on the same digital power supply as on-die digital units used for thermal mapping, and when the sensors are multiplied, can result in unacceptably large area and power consumption.

Most thermal sensors require thermal calibration for accurate readings during a functional mode. A known way of performing this calibration is by forcing a known temperature on the chip surroundings and reducing the power consumption inside the integrated circuit (also referred to as a "chip"), such that the temperature inside the chip ($T_{junction}$) will be equal to the forced temperature ($T_{case}$). During the calibration, specific sensor values (e.g., calibrated temperature values) of each thermal sensor are recorded and stored, e.g., in e-fuse registers. Those stored values are assigned to each thermal sensor and are then employed during functional operation to improve the accuracy of thermal readings for the thermal sensors.

In certain IC chips or dice in which each thermal sensor relies on a separate analog voltage supply, one technique is to turn off the digital power supply to better control temperature on-die. The assumption is that most of the power consumption comes from the digital units using the digital power supply. After turning off the digital power supply, the entire device power consumption is nearly zero, and hence the junction temperature is nearly the case temperature. This model is simplified as expressed by:

$$T_{junction} \cong T_{case} + \theta \cdot P \underset{P \to 0}{\Longrightarrow} T_{junction} \cong T_{case}$$

where $T_{junction}$ is the on-die temperature, $T_{case}$ is the environmental temperature (e.g., temperature on both wafer and package-level testing), P is power consumption, and $\theta$ is a thermal coupling coefficient. Since the digital domain-based thermal sensors share the same digital power supply with the digital units of the chip, however, it is not possible to turn off the digital power supply because the thermal sensors have to be functional. Therefore, calibrating digital thermal sensors may require additional solutions for compensating and controlling the digital power supply. Further, a major contributor to power consumption in an IC chip can be the digital core, which uses the digital power supply. Therefore, while calibrating a regular thermal-sensor, which does not use the digital power supply, most of the power consumption is disabled since it is possible to turn off the thermal sensor. Hence, the $T_{case}$ and the $T_{junction}$ can be approximately the same. In the present application, since it is not possible to turn off the digital power supply during calibration, the major contributor to power consumption in the IC chip remains active, resulting in a meaningful deviation of $T_{case}$ from $T_{junction}$.

Figure 2:
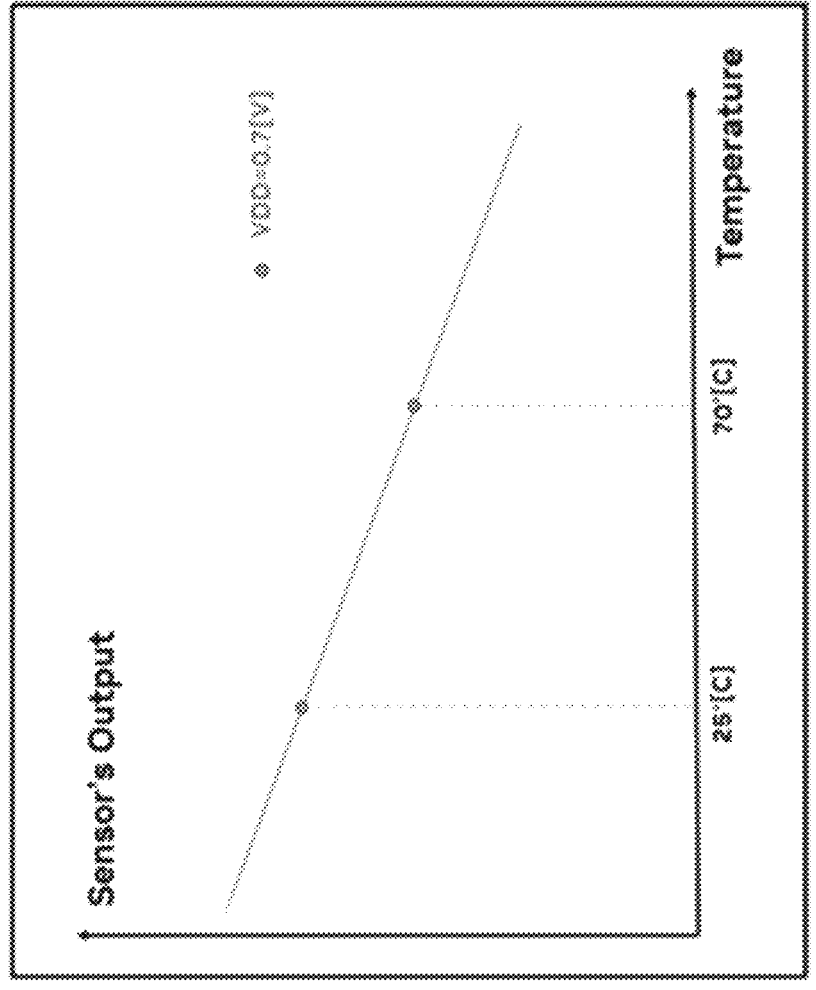
FIG. 2 is a graph illustrating common approaches to thermal calibration in which thermal temperature values can be extracted from a pair of calibrated temperature values according to some embodiments.

In some scenarios, thermal calibrations are not sufficiently accurate because they are based on certain assumptions, e.g., that the calibration procedure is based on linear proportional-to-absolute-temperature (PTAT) behavior between the thermal sensor results versus actual temperature and that the on-die temperature forced during the calibration is performed accurately. In some such calibration techniques, as illustrated in FIG. 2, a system or device measures two points at two different temperatures (e.g., illustrated are 25° C. and 70° C.) and determines the PTAT function of each sensor that assumes to define a curve over all temperature values.

Figure 5:
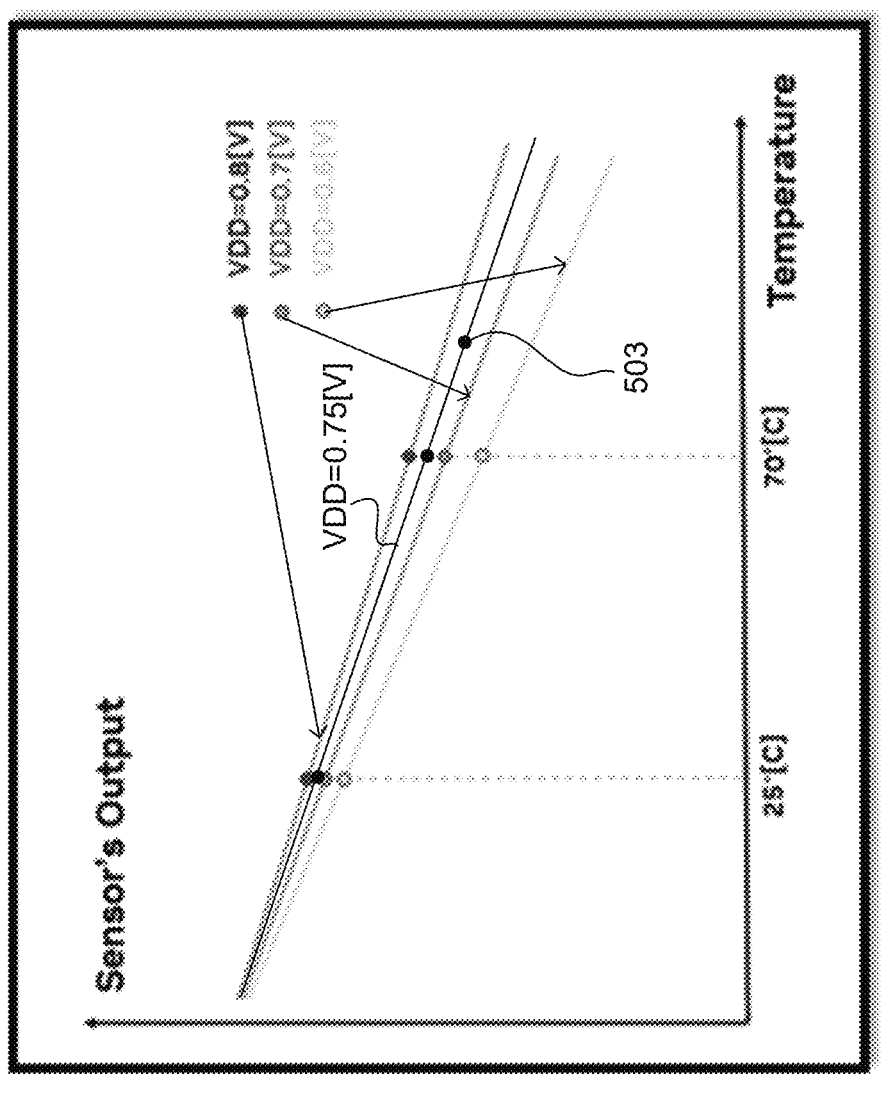
FIG. 5 is a graph illustrating multiple calibration lines determined for different digital power supply (Vdd) values between which an additional calibration line can be determined according to some embodiments.

In these calibration techniques, calibration error is mainly caused by the difficulty of keeping both calibration points at the precise temperature on which calibration is assumed, but related to the present disclosure, is also caused by variations in power supply. For example, the illustrated curve may be associated with a digital power supply (Vdd) value of 0.7 volts (V), but the curve might shift up or down if the Vdd value were to change for a particular sensor. At least one reason for this variation includes that higher Vdd values are typically associated with higher temperatures, which is illustrated in FIG. 5.

Aspects and embodiments of the present disclosure address the above and other deficiencies with former thermal calibration techniques outlined above by performing the calibration of the IC chip based on a plurality of power supply values, which generates sets of calibrated temperature values for each power supply value. For example, each calibrated temperature value can be generated for a different temperature read out from the thermal sensor, and each set of calibrated temperature values can correspond to a different power supply value generated for that thermal sensor. In this way, calibrations provide a relationship between ranges of power supply values and the calibrated temperature values that should be used to determine an actual (e.g., operational) temperature value during real-time operation of the IC die or chip.

In various embodiments, once these calibrated temperature values are known and stored in e-fuse registers, control logic on-board the IC chip can measure a present power supply value associated with a particular thermal sensor (e.g., that is located nearest to the thermal sensor). The control logic can then generate, based on the present power supply value and the plurality of power supply values, a calibration equation that relates sets of calibrated temperature values to thermal sensor values for the present power supply value, which will be discussed in more detail.

In embodiments, once the equation has been generated, the control logic can read the thermal sensor value from the thermal sensor and determine a calibrated temperature value using the thermal sensor value within the calibration equation. This calibrated temperature value (the reliable temperature output) can be employed by the control logic for temperature mapping, to make temperature-based decisions on chip, or be sent off-chip for higher-level temperature analysis and operations.

Therefore, advantages of the IC chips, dice, systems, and methods implemented in accordance with some embodiments of the present disclosure include, but are not limited to, the ability to perform a more-granular thermal calibration that is also based on power supply value. Additional advantages include increasing the accuracy of thermal calibrated values by analyzing previous sets of calibrated temperature values as related to corresponding power supply values in order to compensate the calibrated temperature value to be used according to a presently read power supply value. Other advantages will be apparent to those skilled in the art of thermal sensor design and calibration within digital domains, as will be discussed hereinafter.

Figure 1B:
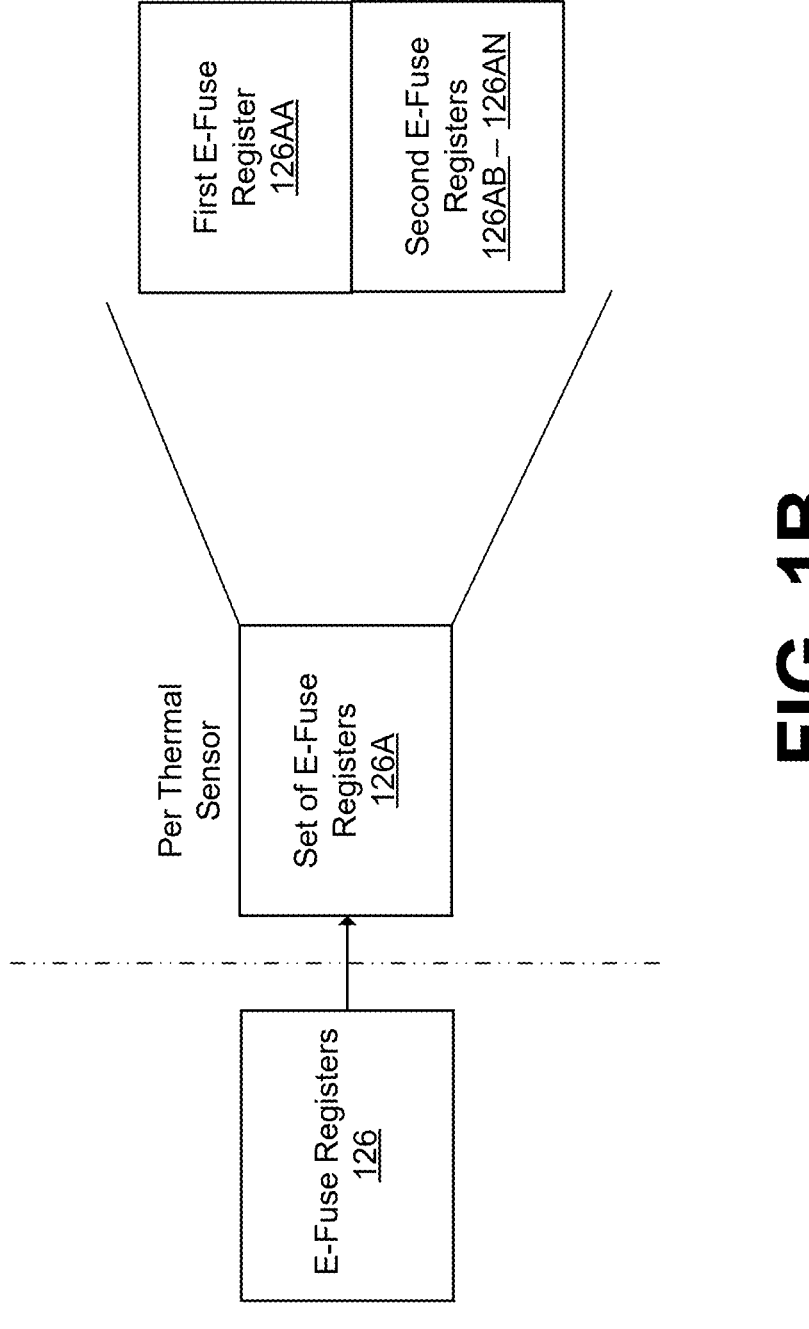

FIGS. 1A-1B are a schematic block diagram of an example thermal testing system 100 implementing power supply-based compensation for die thermal sensing according to various embodiments. In various embodiments, the system 100 includes an IC die 102 (or IC chip) to be calibrated for temperature according to power supply voltage, and a tester unit 150 that can be coupled to the IC die 102 to aid in the temperature calibration. In at least some embodiments, the IC die 102 (or IC chip) is or includes a central processing unit (CPU), a graphics processing unit (GPU), or a data processing unit (DPU).

In at least some embodiments, the IC die 102 includes an optional variable DC-to-DC converter 103, a power delivery network (or PDN 104) that powers digital units of the chip, including a plurality of analog-to-digital converters or ADCs 140, a plurality of thermal sensors 144 powered by a power supply voltage (e.g., Vdd), a plurality of e-fuse registers 126 associated with the plurality of thermal sensors 144, digital domain circuitry 115, and one or more processing cores 120. In varying embodiments, the variable DC-to-DC converter 103 is disposed on a board on which the IC die 102 is disposed or, as illustrated, is disposed on the IC die 102 itself. In embodiments, when employed, the variable DC-to-DC converter 103 converts a supply input voltage provided by an external supply voltage to a particular digital supply voltage that is supplied to the PDN 104. Thus, during functional operation, there are at least two mechanisms in the board components that drive the supply voltage to the IC die 102, including DC voltage deviation and dynamic voltage fluctuations. The former may be due to inaccuracies of board components that drive the external supply voltage to the IC die 102 and which can be set differently to different chips. The latter may be due to current/resistance (IR) voltage drop, which is discussed in more detail hereinbelow.

In embodiments, the IC die 102 further includes a memory 146 and optional storage 148. In some embodiments, each thermal sensor 144 provides a thermal sensor value at a location on chip of the IC die 102. In some cases, there is a set of e-fuse registers 126 coupled to each thermal sensor 144. While the focus of the present disclosure is on thermal sensors that have a dependency on a digital supply voltage, the present disclosure can also be applied to another sensor whose output varies with supply voltage, e.g., capacitive touch sensor, motion sensor, or other such sensors. Digital supply voltages, however, vary more than analog supply voltages, particularly where sensors are in a large spatial area, e.g., related to larger IC chips.

In some embodiments, the processing core(s) 120 include at least a portion of the digital domain circuitry 115. In embodiments, the IC die 102 also includes control logic 130 coupled to at least the digital domain circuitry 115, the ADCs 140, and the e-fuse registers 126. In embodiments, the control logic 130 is integrated within one of the processing core(s) 120. In some embodiments, the control logic 130 is hardware, firmware, software, or a combination thereof designed to perform the operations disclosed herein. If executing software or firmware, for example, the storage 148 and/or the memory 146 can store instructions to be executed by the control logic 130 and can also store data associated with operation of the IC die 102.

In various embodiments, each of the plurality of ADCs 140 is coupled to a nearest source of the digital supply voltage, e.g., portion of the PDN 104 that powers a particular thermal sensor 144. In embodiments, the PDN 104 is a passive connectivity network composed of wires that connect the components in the chip to an external supply voltage. As each component has different wiring up to a bump (e.g., interface point where the external supply is connected to the IC die 102) and consumes a different amount of current (and at different times), there is a different dynamic current/resistance (IR) voltage drop. For example, the dynamic IR voltage drop is a result of current passing through resistive wires to each component, effectively resulting in different supply voltages that reach each component.

For example, a first ADC 140A can be located closest to a first thermal sensor 144A, a second ADC 140B located closest to a second thermal sensor 144B, a third ADC 140C located closest to a third thermal sensor 144C, and an Nth ADC 140N locates closest to an Nth thermal sensor 144N.

The thermal sensors 144, and thus the ADCs 140, can be distributed throughout the digital domain circuitry 115 and the processing core(s) 120, although the digital domain circuitry 115 and the processing core(s) 120 are illustrated separately for convenience. Further, the PDN 104 can distributed to provide the power supply voltage, which is measured by each of the plurality of ADCs 140 at different locations on chip, e.g., nearest portion of the PDN 104 where the thermal sensors 144 are also located.

In embodiments, only by way of example, the first ADC 140A can be associated with (e.g., closest to) the first thermal sensor 144A, and thus be configured to determine a present power supply value of a power supply voltage (Vdd) for the first thermal sensor 144A. The present power supply value can be understood to be sampled from the power supply voltage at a point of the on-chip Vdd being supplied to the first thermal sensor 144A. In this way, each ADC associated with a particular thermal sensor can determine a unique (or more-precise) power supply value to be associated with powering that particular thermal sensor, understanding that Vdd values can vary across the IC die 102 and over time.

In at least some embodiments, the tester unit 150 includes a digital supply voltage generator 154 to generate a digital supply voltage (Vdd) for use by the IC die 102 during the calibration mode, a processing device 156 including calibration logic 158 (although the calibration logic 158 may also exist outside of the processing device 156), memory 160, and storage 164. In some embodiments, the storage 164 includes instructions that are executable by the processing device 156 out of the memory 160 to perform functions encoded as the calibration logic 158. In some embodiments, the calibration logic 158 is at least partially instantiated as hardware logic, but can also include firmware and/or software logic as well.

In some embodiments, the tester unit 150 is configured to, for the first thermal sensor 144A, for example, change the power supply voltage (Vdd) to two or more power supply values, e.g., using the digital supply voltage generator 154. In embodiments, the tester unit 150 provides the particular Vdd value (for calibration of temperature values) from the digital supply voltage generator 154 to the PDN 104 on chip of the IC die 102. The tester unit 150 can further generate, using the first thermal sensor 144A, calibrated temperature values at each power supply value of the two or more power supply values. The tester unit 150 can further store, in a set of the plurality of e-fuse registers 126 associated with the first thermal sensor 144A, the calibrated temperature values at each power supply value. The process can be repeated for each thermal sensor of the plurality of thermal sensors 144 and corresponding e-fuse registers 126 for each thermal sensor.

In some embodiments, the plurality of e-fuse registers 126 are coupled to the plurality of thermal sensors 144. In these embodiments, the calibration logic 158 writes calibrated thermal values to the plurality of e-fuse registers 126 for use by the plurality of thermal sensors 144 during functional mode, e.g., operational mode after thermal calibration. For example, during a production phase, an array of calibration temperature values can be determined per each forced temperature value, e.g., previously discussed as 25° C. and 70° C. During an operational phase and at a pre-defined period (or cycle) that may be pre-programmed, the control logic 130 can perform two different and independent readout actions, e.g., a thermal sensor readout and a power supply readout. The control logic 130 (e.g., firmware or software) can then generate a post-processing algorithm for a particular power supply value from which an operational calibrated temperature value can be determined. According to the power supply readout, the control logic 130 can calculate a new effective calibration value, and from those values the temperature is interpolated or extrapolated, thus enhancing functional mode accuracy by reducing the power supply error contribution to nearly zero.

With additional reference to FIG. 1B, the calibrated temperature values can be stored in different e-fuse registers of a set of e-fuse registers 126A, e.g., of the plurality of e-fuse registers 126. As will be discussed in more detail with reference to FIGS. 4A-4B, on a per-thermal sensor basis, the set of e-fuse registers 126A can include a first e-fuse register 126AA to store a first series of bits associated with a nominal power supply value and a plurality of second e-fuse registers 126AB-126AN, each to store a second series of bits characterizing a difference from the first series of bits for a different power supply value. In embodiments, the second series of bits are fewer than the first series of bits. In this way, the stored values used for real-time thermal reading operations can be compacted by storing fewer bits (in the second e-fuse registers 126B) with which to characterize thermal sensor values according to separate calibrated temperature values, for each power supply value, as compared with the nominal power supply (stored in the first e-fuse register 126A).

FIG. 3 is a flow chart of an example method 300 for determining power supply-based compensation for die thermal sensing according to some embodiments. The method 300 can be performed by processing logic comprising hardware, software, firmware, or any combination thereof. For example, the method 300 can be performed by the control logic 130 on the IC die 102 and/or by the calibration logic 158 on the tester unit 150 (see FIG. 1A). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible At operation 310, the processing logic reads an analog-to-digital converter (ADC) 140 located closest to a thermal sensor, of the plurality of thermal sensors 144, to determine a present power supply value.

At operation 320, the processing logic reads, from the plurality of e-fuse registers 126 that are associated with the thermal sensor, a set of calibrated temperature values for each power supply value of a plurality of power supply values. In embodiments, the processing logic obtains the present power supply value and the plurality of power supply values from a digital domain power supply voltage.

At operation 330, the processing logic generates, based on the present power supply value and the plurality of power supply values, a calibration equation that relates calibrated temperature values to thermal sensor values for the present power supply value. Generation of the calibration equation is discussed in more detail with reference to FIG. 5. Once the calibration equation is known, than a calibrated temperature value for the thermal sensor can be determined.

For example, at operation 340, the processing logic reads a thermal sensor value from the thermal sensor. At operation 350, the processing logic determines a calibrated temperature value (e.g., operational temperature value) using the thermal sensor value within the calibration equation.

Figure 4A:
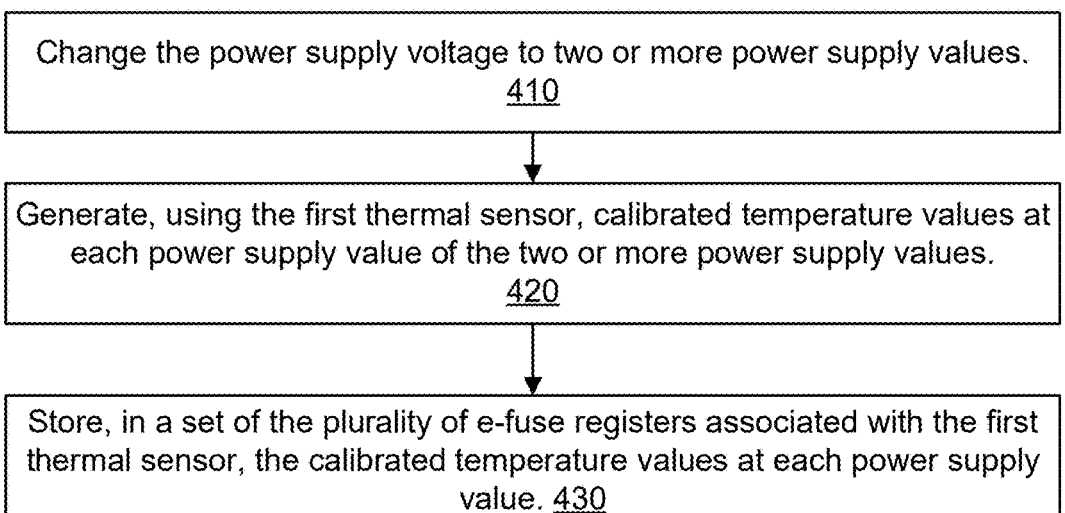
FIG. 4A is a flow chart of a method for calibrating thermal sensors on an IC die using a testing unit according to some embodiments.

FIG. 4A is a flow chart of a method 400A for calibrating thermal sensors on an IC die using a testing unit according to some embodiments. The method 400A can be performed by processing logic comprising hardware, software, firmware, or any combination thereof. For example, the method 400A can be performed by the calibration logic 158 on the tester unit 150 (see FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic changes the power supply voltage of the tester unit 150 to two or more power supply values. In some embodiments, the method 400A is performed multiple times, each time at a different power supply value supplied to the IC die 102. Further, in some embodiments, the method 400A can be understood as being applied to the first thermal sensor 140A, which is used by way of example. The method 400A, however, can also be applied each of the plurality of thermal sensors 144, to generate sets of calibrated temperature values for each thermal sensor.

At operation 420, the processing logic generates, using the first thermal sensor 140A, calibrated temperature values at each power supply value of the two or more power supply values.

At operation 430, the processing logic stores, in a set of the plurality of e-fuse registers associated with the first thermal sensor 140A, the calibrated temperature values at each power supply value.

Figure 4B:
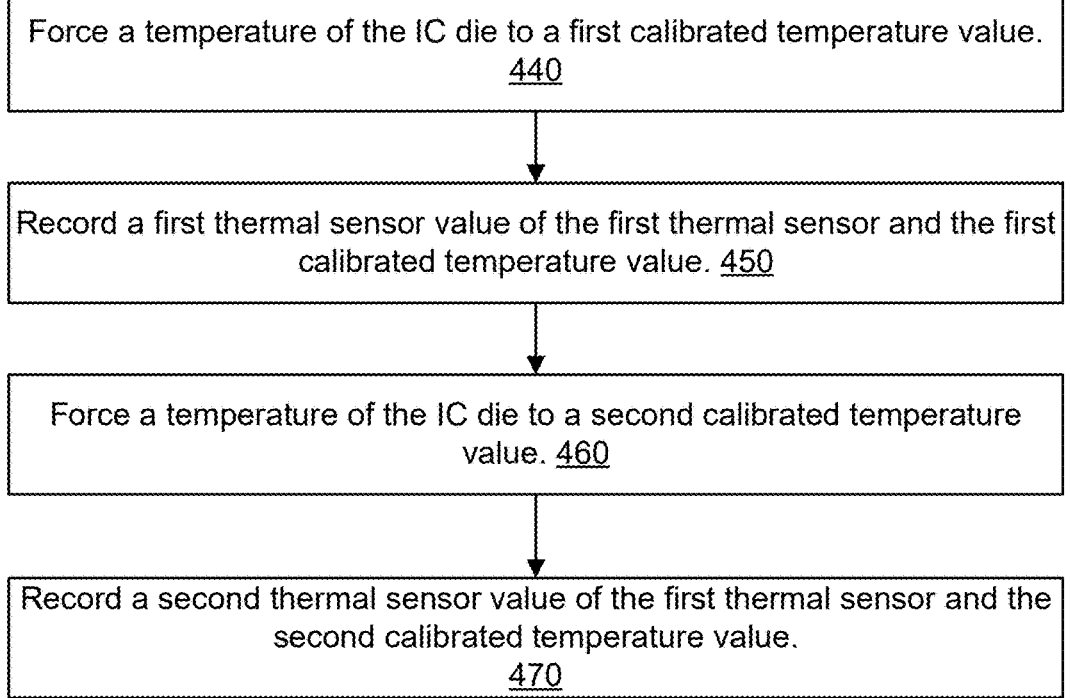
FIG. 4B is a flow chart of a method for implementation operations to perform the calibrating of the thermal sensors according to the method of FIG. 4A according to some embodiments.

FIG. 4B is a flow chart of a method 400B for implementation operations to perform the calibrating of the thermal sensors according to the method 400A of FIG. 4A according to some embodiments. The method 400B can be performed by processing logic comprising hardware, software, firmware, or any combination thereof. For example, the method 400B can be performed by the calibration logic 158 on the tester unit 150 (see FIG. 1), e.g., and can be performed for each power supply value read out by an associated ADC 140. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 440, the processing logic forces a temperature of the IC die 102 to a first calibrated temperature value. In some embodiments, the first calibrated temperature value is 25° C., or another similar lower temperature value (e.g., 18° C., 20° C., 27° C., or the like).

At operation 450, the processing logic records a first thermal sensor value of the first thermal sensor 140A and the first calibrated temperature value.

At operation 460, the processing logic forces a temperature of the IC die to a second calibrated temperature value. In some embodiments, the second calibrated temperature value is 75° C., or another similar higher temperature value (e.g., 69° C., 72° C., 77° C., or the like).

At operation 470, the processing logic records a second thermal sensor value of the first thermal sensor and the second calibrated temperature value.

With additional reference to FIG. 1B, for cost reduction, nominal Vdd-based calibrated temperature values can be stored nominally, e.g., in the first e-fuse register 126AA of the set of e-fuse registers 126A. In embodiments, other calibration values are stored relative to the nominal Vdd-based calibrated temperature values. In this way, a high resolution of calibration information can be stored in the set of e-fuse registers 126A while reducing the e-fuse count and therefore reducing the product cost. For example, for 16 bits resolution, a single e-fuse register can be used (16b @ 25° C.+16b @ 70° C.=32b) per sensor at nominal power supply. Further, for each other calibrated temperature value, only a half e-fuse register can be employed corresponding to other power supply values (8b @ 25° C.+8b @ 70° C.=16b) by storing the difference from nominal value. For example, when the first bit of the eight bits is a sign bit, the remaining seven bits can be the differential value. These 8-bit values can be stored in respective e-fuse registers of the plurality of second e-fuse registers 126AB-126AN.

Thus, by way of summary and with further reference to FIG. 4B, the first e-fuse register 126AA of the set of e-fuse registers 126A can store, for a nominal power supply value, a first series of bits characterizing a combination of: i) the first thermal sensor value and the first calibrated temperature value; and ii) the second thermal sensor value and the second calibrated temperature value. Further, each of the plurality of second e-fuse registers 126A-126AN can store a second series of bits characterizing a difference from the first series of bits for a different power supply value of the two or more power supply values. In some embodiments, the second series of bits are fewer than the first series of bits to make storing the calibrated temperature values more compact. In some embodiments, the second series of bits includes a first set of bits to characterize a third thermal sensor value and the first calibrated temperature value, where a first bit of the first set of bits is a sign bit. The second series of bits can further include a second set of bits to characterize a fourth sensor value and the second calibrated temperature value, where a first bit of the second set of bits is a sign bit.

FIG. 5 is a graph illustrating multiple calibration lines determined for different digital power supply (Vdd) values between which an additional calibration line can be determined according to some embodiments. In general, power supply dependency can be relatively small. Hence, if the control logic 130 stores calibration values in descending resolution, e.g., a calibration point every 50 mV to 100 mV on the supply specifications range, the control logic 130 can interpolate an effective calibration temperature value with nearly zero power supply error. As illustrated, if the VDD readout is 0.75 ml (e.g., at point 403 on the graph) the control logic 130 can linearly interpolate both a 25° C. calibration value and a 70° C. calibration value from the stored data (calibrated temperature values) corresponding to a Vdd power supply value of 0.7V and 0.8V for the result of new effective calibration values, e.g., of 0.75V in this example. This concept of three-dimensional piecewise linear calibration surface eliminates the power supply dependency almost completely. In this way, each Vdd value can have a corresponding two-dimensional surface that can be calculated for interpolation of a calibration line containing calibrated temperature values versus sensor outputs, e.g., new effective calibration values.

In some embodiments, therefore, and with continued reference to FIGS. 4A-4B, the control logic 130 extrapolates the first calibrated temperature value and the second calibrated temperature value associated with at least one power supply value, of the plurality of power supply values, located nearest to the present power supply value to a first extrapolated calibrated temperature value and a second extrapolated calibrated temperature value, respectively. The control logic 130 can then generate the calibration equation that characterizes a calibration line that includes the first and second extrapolated calibrated temperature values.

Other variations are within the scope of the present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein, and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, the terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to actions and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, a "processor" may be a network device or a MACsec device. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, the terms "system" and "method" are used herein interchangeably insofar as the system may embody one or more methods, and methods may be considered a system.

In the present document, references may be made to obtaining, acquiring, receiving, or inputting analog or digital data into a sub-system, computer system, or computer-implemented machine. In at least one embodiment, the process of obtaining, acquiring, receiving, or inputting analog and digital data can be accomplished in a variety of ways, such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface, or an inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that the subject matter claimed in appended claims is not necessarily limited to specific features or acts described. Rather, specific features and acts are disclosed as exemplary forms of implementing the claims.

What is claimed is:

1. An integrated circuit comprising:

an analog-to-digital converter (ADC), associated with a thermal sensor, to determine a present power supply value of a power supply voltage for the thermal sensor;

a plurality of e-fuse registers to store a set of calibrated temperature values, from the thermal sensor, for each power supply value of a plurality of power supply values; and control logic coupled to the ADC and the plurality of e-fuse registers, the control logic to:

read the present power supply value from the ADC; and generate, based on the present power supply value and the plurality of power supply values, a calibration equation that relates calibrated temperature values to thermal sensor values for the present power supply value.

2. The integrated circuit of claim 1, wherein the ADC is an ADC, of a plurality of ADCs, that is located closest to the thermal sensor of a plurality of thermal sensors.

3. The integrated circuit of claim 1, further comprising the thermal sensor to provide a thermal sensor value at a location on chip of the integrated circuit.

4. The integrated circuit of claim 3, wherein the control logic is further to:

read at least some of the plurality of power supply values from the e-fuse registers;

read the thermal sensor value from the thermal sensor; and determine a calibrated temperature value using the thermal sensor value within the calibration equation.

5. The integrated circuit of claim 1, further comprising a power supply network that provides the power supply voltage that can be measured by the ADC.

6. The integrated circuit of claim 1, wherein the plurality of e-fuse registers comprises:

a first e-fuse register to store, for a nominal power supply value, a first series of bits characterizing a combination of: i) a first thermal sensor value and a first calibrated temperature value; and ii) a second thermal sensor value and a second calibrated temperature value; and a plurality of second e-fuse registers, each to store a second series of bits characterizing a difference from the first series of bits for a different power supply value, wherein the second series of bits are fewer than the first series of bits.

7. The integrated circuit of claim 6, wherein the second series of bits comprises:

a first set of bits to characterize a third thermal sensor value and the first calibrated temperature value, wherein a first bit of the first set of bits is a sign bit; and a second set of bits to characterize a fourth sensor value and the second calibrated temperature value, wherein a first bit of the second set of bits is a sign bit.

8. The integrated circuit of claim 6, wherein, to generate the calibration equation, the control logic is to:

extrapolate the first calibrated temperature value and the second calibrated temperature value associated with at least one power supply value, of the plurality of power supply values, located closest to the present power supply value to a first extrapolated calibrated temperature value and a second extrapolated calibrated temperature value; and generate the calibration equation that characterizes a calibration line that includes the first and second extrapolated calibrated temperature values.

9. A system comprising:

an integrated circuit (IC) die comprising:

a plurality of thermal sensors powered by a power supply voltage; and a plurality of e-fuse registers associated with the plurality of thermal sensors;

a tester unit coupled to the IC die to perform thermal calibration of the IC die, wherein the tester unit comprises calibration logic to, for a first thermal sensor of the plurality of thermal sensors:

change the power supply voltage to two or more power supply values;

generate, using the first thermal sensor, calibrated temperature values at each power supply value of the two or more power supply values; and store, in a set of the plurality of e-fuse registers associated with the first thermal sensor, the calibrated temperature values at each power supply value.

10. The system of claim 9, wherein the power supply voltage comprises a digital domain power supply voltage.

11. The system of claim 9, wherein the calibration logic is further to, for each power supply value:

force a temperature of the IC die to a first calibrated temperature value;

record a first thermal sensor value of the first thermal sensor and the first calibrated temperature value;

force a temperature of the IC die to a second calibrated temperature value; and record a second thermal sensor value of the first thermal sensor and the second calibrated temperature value.

12. The system of claim 11, wherein the set of the plurality of e-fuse registers comprises:

a first e-fuse register to store, for a nominal power supply value, a first series of bits characterizing a combination of: i) the first thermal sensor value and the first calibrated temperature value; and ii) the second thermal sensor value and the second calibrated temperature value; and a plurality of second e-fuse registers, each to store a second series of bits characterizing a difference from the first series of bits for a different power supply value of the two or more power supply values, wherein the second series of bits are fewer than the first series of bits.

13. The system of claim 12, wherein the second series of bits comprises:

a first set of bits to characterize a third thermal sensor value and the first calibrated temperature value, wherein a first bit of the first set of bits is a sign bit; and a second set of bits to characterize a fourth sensor value and the second calibrated temperature value, wherein a first bit of the second set of bits is a sign bit.

14. A method comprising:

reading, using control logic on an integrated circuit, an analog-to-digital converter (ADC) located closest to a thermal sensor, of a plurality of thermal sensors, to determine a present power supply value;

reading, from a plurality of e-fuse registers that are associated with the thermal sensor, a set of calibrated temperature values for each power supply value of a plurality of power supply values; and generating, using the control logic, based on the present power supply value and the plurality of power supply values, a calibration equation that relates calibrated temperature values to thermal sensor values for the present power supply value.

15. The method of claim 14, further comprising obtaining the present power supply value and the plurality of power supply values from a digital domain power supply voltage.

16. The method of claim 14, further comprising:

reading a thermal sensor value from the thermal sensor; and determining a calibrated temperature value using the thermal sensor value within the calibration equation.

17. The method of claim 14, wherein reading the set of calibrated temperature values from the plurality of e-fuse registers comprises retrieving, from the plurality of e-fuse registers:

a first series of bits for a nominal power supply value, the first series of bits characterizing a combination of: i) a first thermal sensor value and a first calibrated temperature value; and ii) a second thermal sensor value and a second calibrated temperature value; and a second series of bits for a different power supply value other than the nominal power supply value, the second series of bits characterizing a difference in power supply value from the first series of bits.

18. The method of claim 17, wherein the second series of bits are fewer than the first series of bits.

19. The method of claim 17, wherein the second series of bits comprises:

a first set of bits to characterize a third thermal sensor value and the first calibrated temperature value, wherein a first bit of the first set of bits is a sign bit; and a second set of bits to characterize a fourth sensor value and the second calibrated temperature value, wherein a first bit of the second set of bits is a sign bit.

20. The method of claim 17, wherein generating the calibration equation comprises:

extrapolating the first calibrated temperature value and the second calibrated temperature value associated with at least one power supply value, of the plurality of power supply values, located nearest to the present power supply value to a first extrapolated calibrated temperature value and a second extrapolated calibrated temperature value; and generating the calibration equation that characterizes a calibration line that includes the first and second extrapolated calibrated temperature values.

\* \* \* \* \*